(12) United States Patent
Chou et al.

(10) Patent No.: US 10,164,183 B2
(45) Date of Patent: Dec. 25, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chung-Yen Chou, Hsinchu (TW); Ching-Pei Hsieh, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/419,422

(22) Filed: Jan. 30, 2017

(65) Prior Publication Data
US 2018/0151799 A1 May 31, 2018

Related U.S. Application Data

(60) Provisional application No. 62/427,265, filed on Nov. 29, 2016.

(51) Int. Cl.
*H01L 45/00* (2006.01)
*H01L 27/24* (2006.01)

(52) U.S. Cl.
CPC ...... *H01L 45/1233* (2013.01); *H01L 27/2436* (2013.01); *H01L 45/1253* (2013.01); *H01L 45/146* (2013.01); *H01L 45/1616* (2013.01); *H01L 45/1675* (2013.01)

(58) Field of Classification Search
CPC ... H01L 45/45; H01L 45/1253; H01L 45/124; H01L 45/1666; H01L 27/2481; H01L 27/1021; H01L 45/1233; H01L 45/146; H01L 45/1675; H01L 45/1616; H01L 27/2436
See application file for complete search history.

(56) References Cited

U.S. PATENT DOCUMENTS

| | | | | |
|---|---|---|---|---|
| 8,049,305 B1* | 11/2011 | Miller | ................ | H01L 27/2409 257/30 |
| 9,461,245 B1* | 10/2016 | Yang | ................... | H01L 45/1253 |
| 2009/0200640 A1* | 8/2009 | Hosoi | ................... | H01L 27/101 257/536 |
| 2009/0230378 A1* | 9/2009 | Ryoo | ................. | G11C 11/5664 257/4 |
| 2013/0146833 A1* | 6/2013 | Russo | ..................... | H01L 45/06 257/5 |
| 2013/0214234 A1* | 8/2013 | Gopalan | ............... | H01L 45/085 257/3 |
| 2014/0264245 A1* | 9/2014 | Walls | .................. | H01L 45/1253 257/4 |
| 2015/0214480 A1* | 7/2015 | Hsu | ...................... | H01L 45/1233 257/4 |
| 2016/0104840 A1* | 4/2016 | Cook | .................. | H01L 45/1233 257/4 |

\* cited by examiner

*Primary Examiner* — Caridad Everhart
(74) *Attorney, Agent, or Firm* — McClure, Qualey & Rodack, LLP

(57) ABSTRACT

A semiconductor device includes at least one bottom electrode, a resistive layer, and a top electrode. The bottom electrode has two opposite sidewalls. The resistive layer is disposed on the bottom electrode, extends past at least one of the two opposite sidewalls of the at least one bottom electrode, and has a variable resistance. The resistive layer is disposed on the bottom electrode and extends past at least one of the two opposite sidewalls of the at least one bottom electrode.

20 Claims, 10 Drawing Sheets

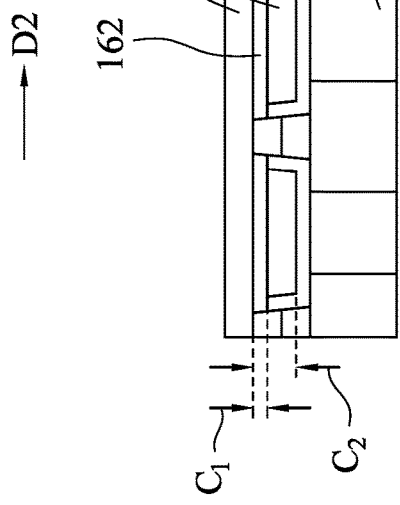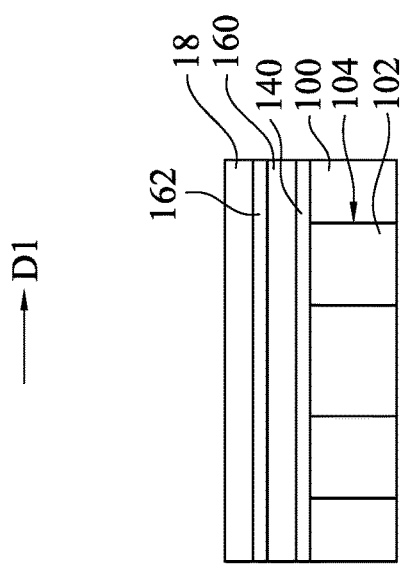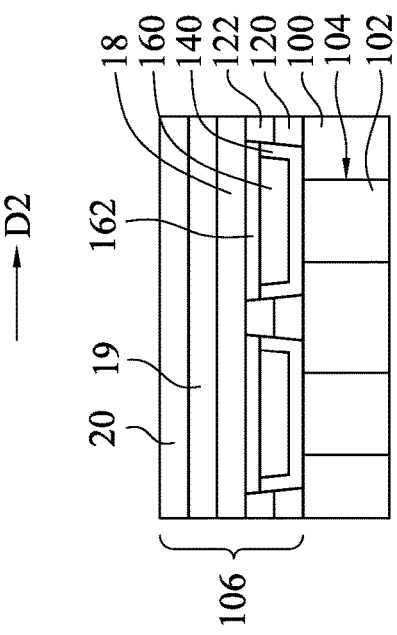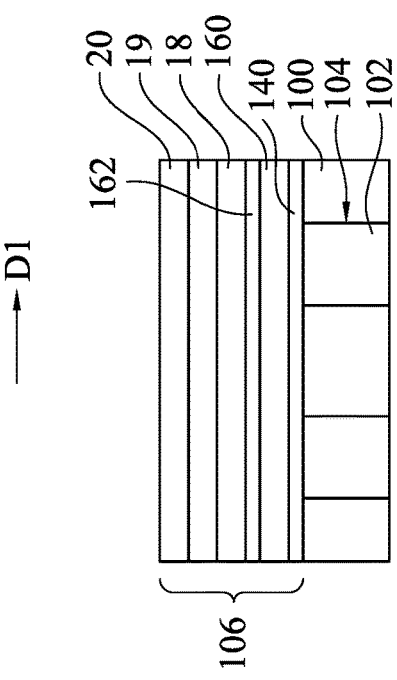

SEMICONDUCTOR DEVICE AND MANUFACTURING METHOD THEREOF

PRIORITY CLAIM AND CROSS-REFERENCE

This application claims priority to U.S. Provisional Application Ser. No. 62/427,265, filed Nov. 29, 2016, which is herein incorporated by reference.

BACKGROUND

Modern electronic devices contain higher and higher capacity of electronic memory configured to store more data. The electronic memory may be categories into volatile memory and non-volatile memory. Volatile memory stores data when it is powered, while non-volatile memory is able to keep data when power is off. Resistive random access memory (RRAM) is a candidate for next generation of the non-volatile memory technology, in view of its simple structure and complementary metal-oxide-semiconductor (CMOS) logic compatible process technology. An RRAM cell includes a resistive layer having a variable resistance, which is placed between two electrodes disposed within back-end-of-the-line (BEOL) metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-13A are cross-sectional views of the semiconductor device at various stages of fabrication along line A-A in FIG. 1;

FIGS. 2B-13B are cross-sectional views of the semiconductor device at various stages of fabrication along line B-B in FIG. 1;

DETAILED DESCRIPTION

Figure 1:
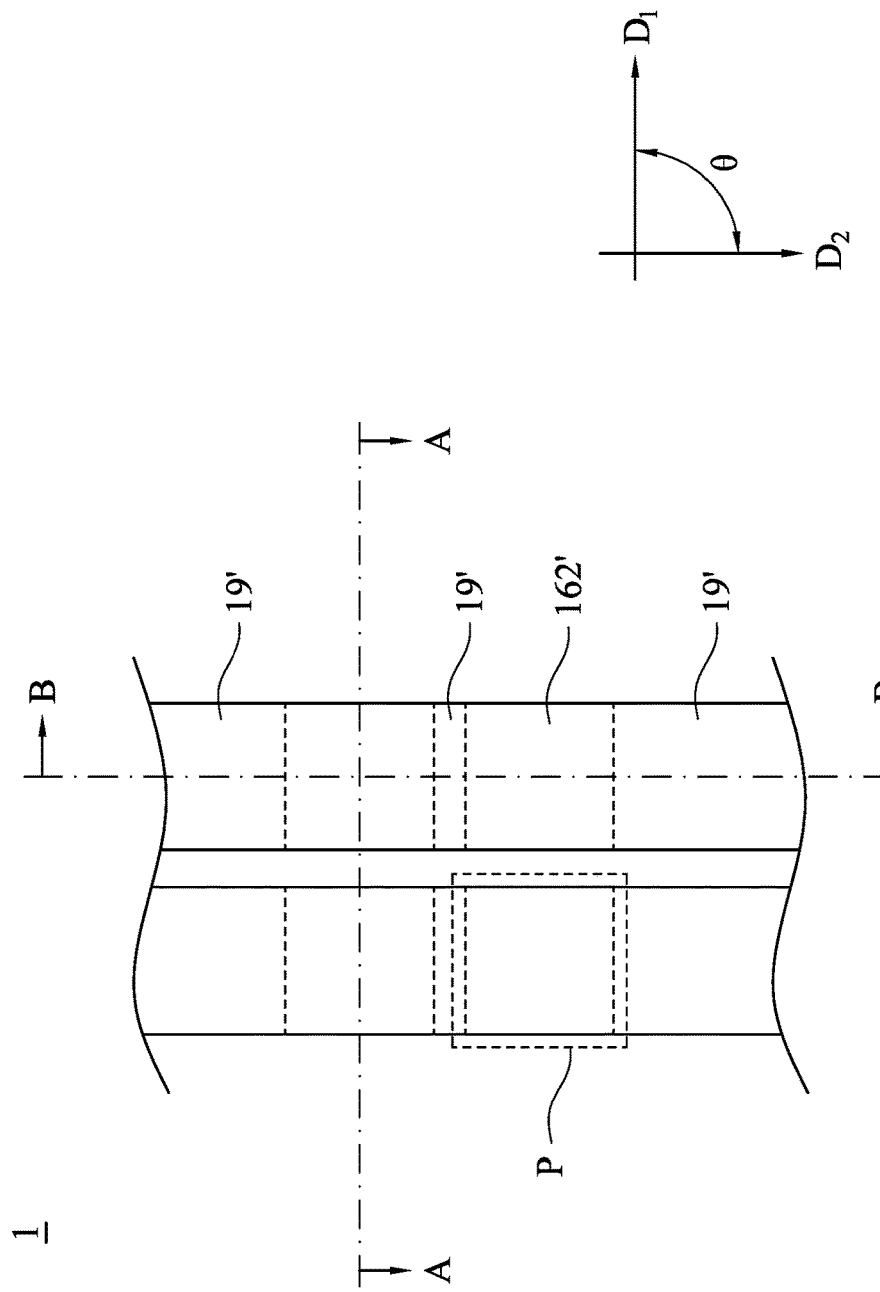
FIG. 1 is a top view of a local semiconductor device according with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the singular forms "a," "an" and "the" include plural referents unless the context clearly dictates otherwise. Therefore, reference to, for example, a gate stack includes aspects having two or more such gate stacks, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices have emerged as a candidate for a next generation of electronic data storage. A resistive random access memory device includes a conductive bottom electrode separated from a conductive top electrode by a resistive layer having a variable resistance. The resistive random access memory device stores data based upon resistive switching, which allows the resistive random access memory device to change the electrical resistance of a memory device between a high resistive state corresponding to a first data state (e.g., a "0") and a low resistive state corresponding to a second data state (e.g., a "1").

The conductive bottom electrode of a resistive random access memory device can be formed by etching an opening within a dielectric layer and forming a bottom electrode that extends into the opening. However, it has been appreciated that as the size of resistive random access memory devices continue to decrease, the bottom electrode metal often fails to properly fill the opening in the dielectric layer. This results in a depression within an upper surface of the bottom electrode, which may lead to non-planar topographies for the overlying layers. The non-planar topographies can negatively affect the ability of a resistive random access memory device to store data and the reliability of a resistive random access memory device.

FIG. 1 is a top view of a local semiconductor device 1 according with some embodiments of the present disclosure. FIGS. 2A-13A are cross-sectional views of the semiconductor device 1 at various stages of fabrication along line A-A in FIG. 1. FIGS. 2B-13B are cross-sectional views of the semiconductor device 1 at various stages of fabrication along line B-B in FIG. 1. FIG. 1 has been simplified and illustrates a top electrode layer 19' and a refilled bottom electrode 162' for an understanding of the embodiments of the present disclosure. In FIG. 1, the semiconductor device 1 can be a resistive random access memory device including a plurality of memories cells P. The line A-A extends along a first direction D1, and the line B-B extends along a second direction D2. In some embodiments, the line A-A is substantially orthogonal to the line B-B (that is, the first direction D1 is substantially orthogonal to the second direction D2). In some other embodiments, the line A-A intersects the line B-B to form an angle θ therebetween. The term "substantially" as used herein may be applied to modify any quantitative representation which could permissibly vary without resulting in a change in the basic function to which it is related.

Figure 2A:
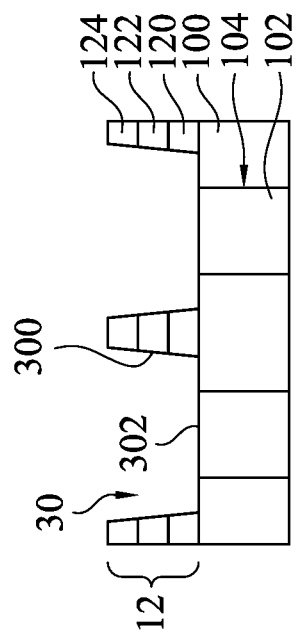
Figure 2B:
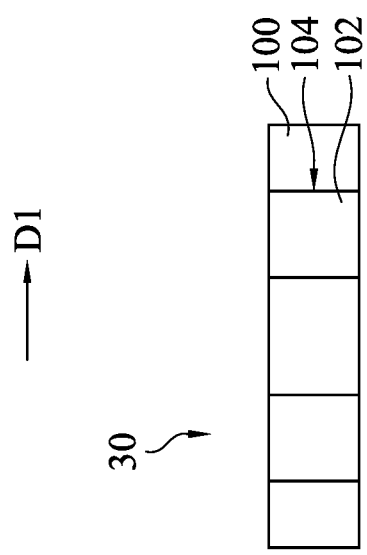

Reference is made to FIGS. 2A and 2B. A lower interlayer dielectric layer 100 is selectively etched (e.g., using a dry etchant) to form an opening 104 or micro-trench. A lower metal interconnect layer 102 is formed in the opening 104. A lower insulating structure 12 is formed onto a lower metal interconnect layer 102 and/or a lower inter-layer dielectric layer 100. In some embodiments, the lower insulating structure 12 may include a multi-film structure having a first insulating film 120, a second insulating film 122, and a third insulating film 124. In some embodiments, the first insulating film 120, the second insulating film 122, and third insulating film 124 individually include or are made of a material, such as, an oxide, a silicon rich oxide, silicon carbide (SiC), and silicon nitride (SiN). For example, the first insulating film 120 may be made of silicon carbide (SiC), the second insulating film 122 may be made of a silicon rich oxide, and the third insulating film 124 may be made of silicon carbide (SiC). In some embodiments, the first insulating film 120, the second insulating film 122, and the third insulating film 124 may be formed using a vapor deposition technique (e.g., physical vapor deposition, chemical vapor deposition, etc.).

Figure 3A:
Figure 3B:
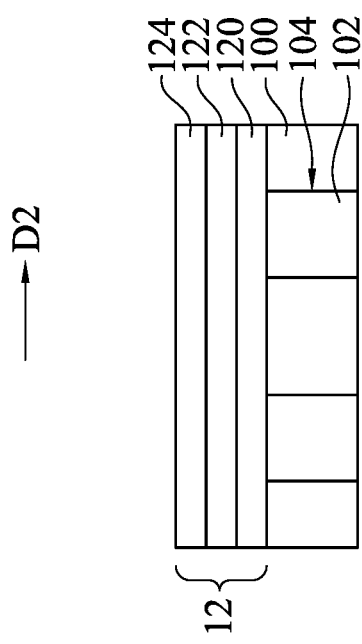

Reference is made to FIGS. 3A and 3B. A first trench 30 is formed in the lower insulating structure 12 to expose the lower metal interconnect layer 102. The first trench 30 may be formed by the etching step(s), such as, a dry or a wet etching and has a side wall 300 and a bottom portion 302. The side wall 300 of the first trench 30 is formed by the side surface of the lower insulating structure 12, and the bottom portion 302 of the first trench 30 is formed by a portion of an upper surface of the lower inter-layer dielectric layer 100 and an upper surface of the lower metal interconnect layer 102.

Figure 4A:
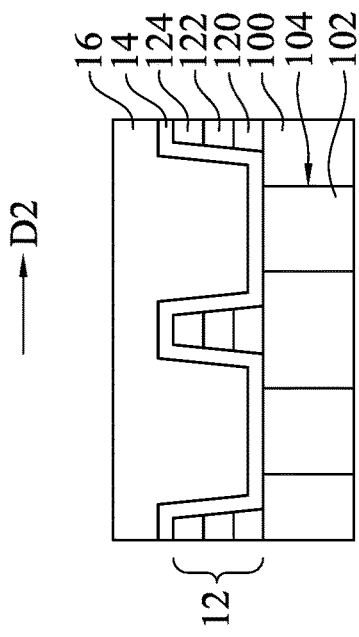
Figure 4B:
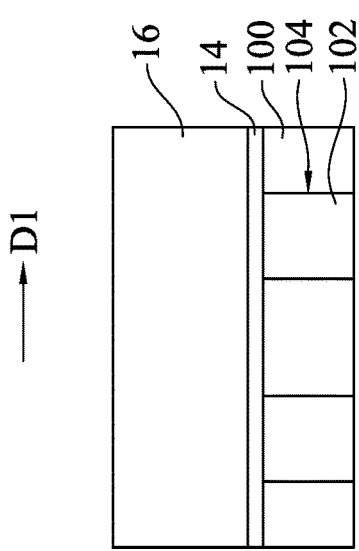

Reference is made to FIGS. 4A and 4B. As shown in FIGS. 4A and 4B, a barrier film 14 is at least formed within the first trench 30. The barrier film 14 is arranged along a bottom surface and along sidewalls of the first trench 30 and over an upper surface of the lower insulating structure 12. In some embodiments, the barrier film 14 may be formed by, for example, chemical vapor deposition (CVD), plasma-enhanced chemical vapor deposition (PECVD), low-pressure chemical vapor deposition (LPCVD), atomic layer deposition (ALD), any suitable processes, or combinations thereof. In some embodiments, the barrier film 14 may include a conductive material, such as titanium (Ti), titanium nitride (TiN), tantalum (Ta), tantalum nitride (TaN), tungsten (W), or copper (Cu), for example.

In FIGS. 4A and 4B, a bottom electrode film 16 is formed onto the barrier film 14. The bottom electrode film 16 fills in a reminder of the first trench 30 and extends over the lower insulating structure 12. In some embodiments, the bottom electrode film 16 may be formed by, for example, chemical vapor deposition (CVD), plasma-enhanced chemical vapor deposition (PECVD), low-pressure chemical vapor deposition (LPCVD), atomic layer deposition (ALD, any suitable processes, or combinations thereof. In some embodiments, the barrier film 14 may include a same material as the bottom electrode film 16. In some other embodiments, the barrier film 14 is made of TaN (tantalum nitride), and the bottom electrode film 16 is made of titanium nitride (TiN), and the present disclosure is not limited in this respect.

Figure 5A:
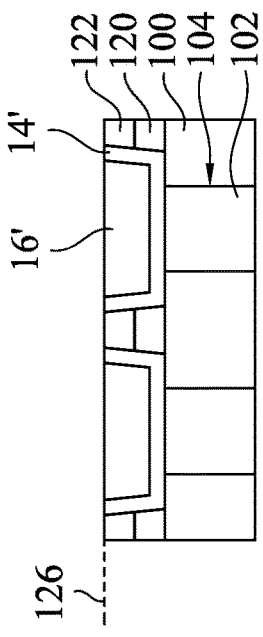
Figure 5B:
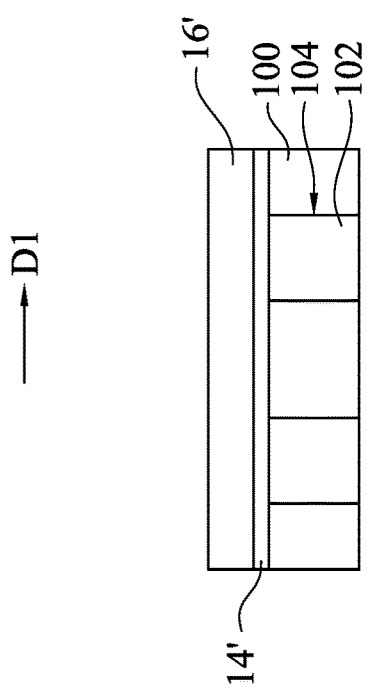

Reference is made to FIGS. 5A and 5B. As shown in FIGS. 5A and 5B, a planarization process is performed to form a first flat surface 126 by removing materials from the barrier film 14 (shown in FIGS. 4A and 4B) and the bottom electrode film 16 (shown in FIGS. 4A and 4B) that are outside of the first trench 30 and above the second insulating film 122 and removing the third insulating film 124 (shown in FIGS. 4A and 4B) to form the barrier layer 14' and the bottom electrode layer 16'. The second insulating film 122 in the lower insulating structure 12 (shown in FIGS. 4A and 4B) may act as an etch stop during the planarization process. The planarization process results in the barrier layer 14' and the bottom electrode layer 16', which have planar upper surfaces that are aligned along a substantially planar horizontal surface. The upper surfaces of the barrier layer 14' and the bottom electrode layer 16' are aligned with an upper surface of the second insulating film 122 in the lower insulating structure 12. In some embodiments, the planarization process may include a chemical mechanical polishing (CMP) process.

Figure 6A:
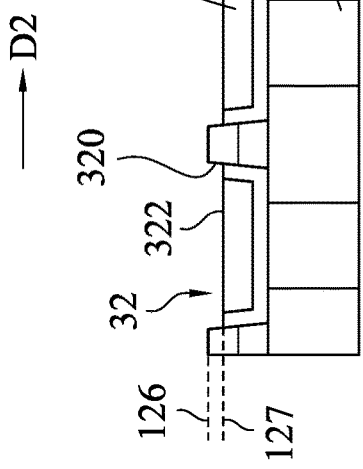
Figure 6B:
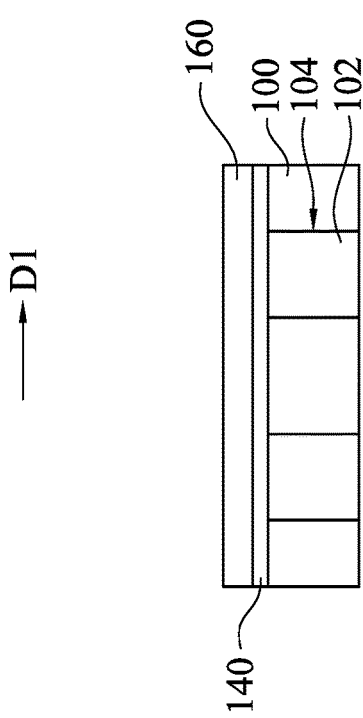

Reference is made to FIGS. 6A and 6B. A controlled etch-back process selective to the barrier layer 14' (shown in FIGS. 5A and 5B) and the bottom electrode layer 16' (shown in FIGS. 5A and 5B), is performed to recess the barrier layer 14' and the bottom electrode layer 16', which results in a second trench 32 to form a second flat surface 127 by removing materials from the barrier layer 14' and the bottom electrode layer 16' that are inside of the first trench 30 and above the first insulating film 120. The controlled etch-back process results in a recessed barrier layer 140 and a recessed bottom electrode layer 160, which have planar upper surfaces that are aligned along a substantially planar horizontal surface. The upper surfaces of the recessed barrier layer 140 and the recessed bottom electrode layer 160 are aligned with a surface located between the upper surface of the second insulating film 122 and the upper surface of the first insulating film 120 in the lower insulating structure 12. That is, the second flat surface 127 is located between the upper surface of the second insulating film 122 and the upper surface of the first insulating film 120, and the upper surfaces of the recessed barrier layer 140 and the recessed bottom electrode layer 160 are aligned with the second flat surface 127. The second trench 32 has a side wall 320 and a bottom portion 322. The side wall 320 of the second trench 32 is formed by at least a portion of the side surface of the second insulating film 122 in the lower insulating structure 12, and the bottom portion 322 of the second trench 32 is formed by the upper surface of the recessed barrier layer 140 and the recessed bottom electrode layer 160. The recessed barrier layer 140 is in contact with the lower insulating structure 12, and the recessed bottom electrode layer 160 is separated from the lower insulating structure 12 by the recessed barrier layer 140.

Figure 7A:
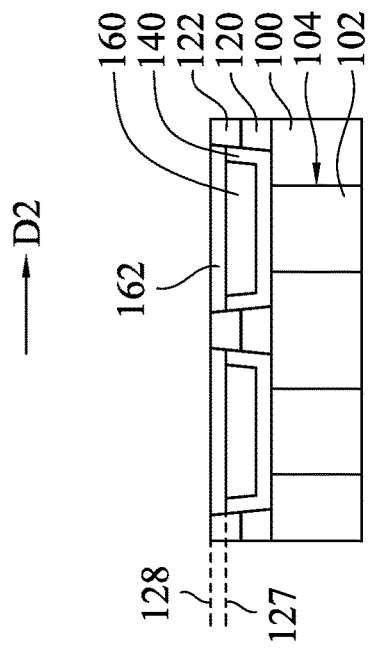
Figure 7B:
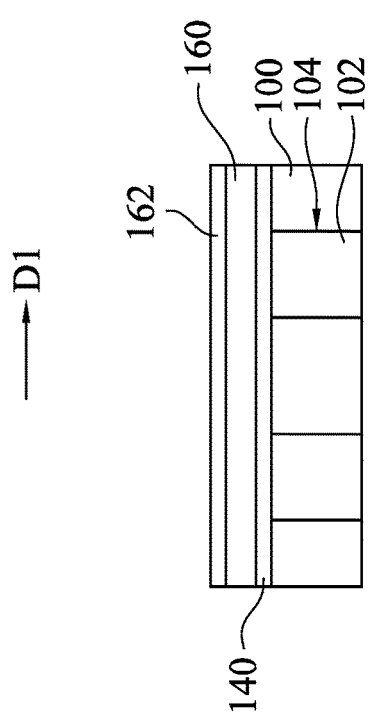

Reference is made to FIGS. 7A and 7B. A refilled bottom electrode film (not shown) is formed within the second trench 32 (shown in FIGS. 6A and 6B). Furthermore, the refilled bottom electrode film is arranged along a bottom surface and along sidewalls of the second trench 32 and over an upper surface of the second insulating film 122. In some embodiments, refilled bottom electrode film may be formed by, for example, chemical vapor deposition (CVD), plasma-enhanced chemical vapor deposition (PECVD), low-pressure chemical vapor deposition (LPCVD), atomic layer deposition (ALD), or combinations thereof. In some embodiments, the refilled bottom electrode film may include a conductive material, such as Titanium (Ti), titanium nitride (TiN), tantalum (Ta), tantalum nitride (TaN), tungsten (W), or copper (Cu), for example.

In FIGS. 7A and 7B, a planarization process is performed to form a third flat surface 128 by removing materials from the refilled bottom electrode film that are outside of the second trench 32 and above the second insulating film 122 to form a refilled bottom electrode layer 162. The location of the third flat surface 128 is substantially the same as the location of the first flat surface 126 (shown in FIGS. 6A and 6B). The second insulating film 122 in the lower insulating structure 12 may act as an etch stop during the planarization process. The planarization process results in the refilled bottom electrode layer 162, which have planar upper surfaces that are aligned along a substantially planar horizontal surface. The upper surfaces of the refilled bottom electrode layer 162 are aligned with an upper surface of the second insulating film 122 in the lower insulating structure 12. In some embodiments, the planarization process may include a chemical mechanical polishing (CMP) process.

In FIGS. 7A and 7B, at least one of the bottom electrode layers of the semiconductor device 1 includes the recessed bottom electrode layer 160 and the refilled bottom electrode layer 162. The bottom electrode layers are formed as strips rather than individually domains which respectively correspond to memory cells of the semiconductor device 1. When the size of the semiconductor device 1 is reduced, the sizes of patterns of the bottom electrode layers are still large enough to satisfy the resolution of the patterning process (see FIGS. 3A and 3B). With such configuration, the distance between adjacent two of the bottom electrode layers is short, and the sizes of the bottom electrode layers are enlarged. In FIGS. 7A and 7B, the strips of the bottom electrode layers extend along the first direction D1 and arranged along the second direction D2.

Reference is made to FIGS. 8A and 8B. As shown in FIGS. 8A and 8B, a resistive film 18 is formed over the refilled bottom electrode layer 162, the second insulating layer 122', and the lower inter-layer dielectric layer 100. That is, the resistive film 18 is in contact with the refilled bottom electrode layer 162 and the second insulating layer 122'. In some embodiments, the resistive film 18 may include a high-k dielectric material having a variable resistance. For example, in some embodiments, the resistive film 18 may include hafnium oxide (HfOX), zirconium oxide (ZrOX), aluminum oxide (AlOX), nickel oxide (NiOX), tantalum oxide (TaOX), or titanium oxide (TiOX). In some embodiments, the resistive film 18 may be formed by, for example, chemical vapor deposition (CVD), plasma-enhanced chemical vapor deposition (PECVD), low-pressure chemical vapor deposition (LPCVD), atomic layer deposition (ALD), any suitable processes, or combinations thereof.

In FIGS. 8A and 8B, the recessed barrier layer 140 is separated from the resistive film 18. Opposite two edges of the recessed barrier layer 140 is separated from the resistive film 18 by a first distance C1 respectively. The distance C1 is substantially the same as the thickness of the refilled bottom electrode layer 162. Furthermore, a center portion of the recessed barrier layer 140 contacting the lower metal interconnect layer 102 is separated from the resistive film 18 by a second distance C2. Alternatively, the recessed barrier layer 140 may be configured to separate from the resistive film 18 by the same distance for the opposite two edges and the center portion thereof. With such configuration, the recessed barrier layer 140 is not in contact with the resistive film 18, such that the switch resistance of the resistive film 18 is determined by the refilled bottom electrode layer 162 rather than by the recessed bottom electrode layer 160 and the recessed barrier layer 140, which may cause different switch resistances in a memory cell if the recessed bottom electrode layer 160 and the recessed barrier layer 140 are made of different materials.

In some embodiments, a capping layer (not shown) may be formed over the resistive layer 18. In some embodiments, the capping layer may include a metal such as titanium (Ti), hafnium (Hf), platinum (Pt), ruthenium (Ru), and/or aluminum (Al). In other embodiments, the capping layer may include a metal oxide such as titanium oxide ($TiO_X$), hafnium oxide ($HfO_X$), zirconium oxide ($ZrO_X$), germanium oxide ($GeO_X$), cesium oxide ($CeO_X$). The capping layer is configured to store oxygen, which can facilitate resistance changes within the resistive layer. In some embodiments, the capping layer may comprise a metal or a metal oxide that is relatively low in oxygen concentration.

Reference is made to FIGS. 9A and 9B. As shown in FIGS. 9A and 9B, a top electrode film 19 is formed over the resistive film 18. In various embodiments, the top electrode film 19 may include a metal nitride, such as, titanium nitride (TiN) or tantalum nitride (TaN)) or a metal, such as, titanium (Ti) or tantalum (Ta). A mask film 20 (may be a hard mask film) is formed over the top electrode film 19, such that the mask film 20, the top electrode film 19, the resistive film 18, the refilled bottom electrode layer 162, the bottom electrode layer 160, and the barrier layer 140 form a resistive random access memory film stack 106. In some embodiments, the mask film 20 includes nitride. For example, the mask film 20 is made of silicon nitride (SiN). However, other materials, such as silicon-oxynitride (SiON), silicon carbide (SiC), or a combination thereof, may also be used. In some embodiments, the mask film 20 is formed by a process such as chemical vapor deposition (CVD), plasma enhanced chemical vapor deposition (PECVD), or low pressure chemical vapor deposition (LPCVD). Alternatively, the mask film 20 may be first made of a silicon oxide and then converted to silicon nitride (SiN) by nitridation.

Figure 10A:
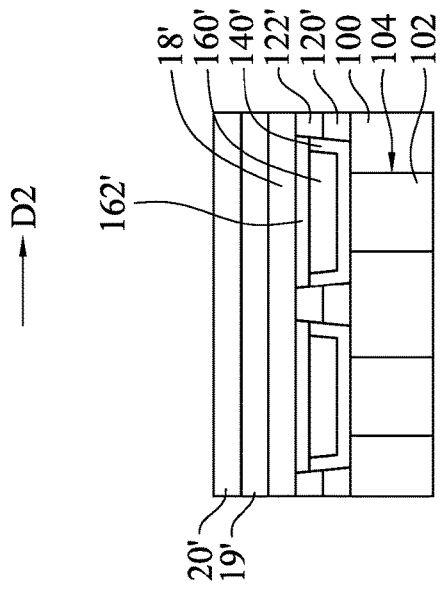
Figure 10B:
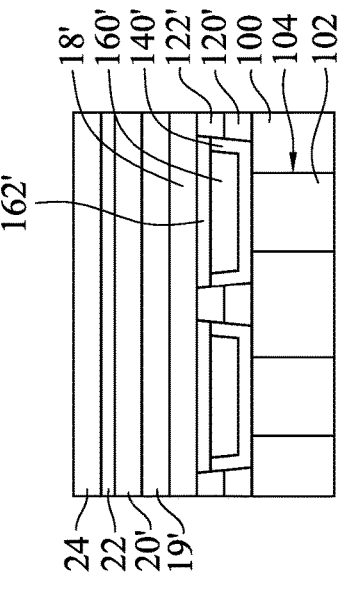

Reference is made to FIGS. 10A and 10B. The mask film 20 is patterned to form a masking layer 20'. The masking layer 20' maintains the integrity of the patterns during etching of plural third trenches 34 formed in the resistive random access memory film stack 106 (shown in FIGS. 9A and 9B). The third trenches 34 are extend along the second direction D2. A first patterning process is performed to selectively pattern the resistive random access memory film stack 106 to form a top electrode 19' over a resistive layer 18'. In FIG. 10B, the resistive layer 18' is in contact with a plurality of the refilled bottom electrode layer 162'.

Reference is made to FIGS. 1, 10A and 10B. The top electrodes 19' are formed as strips rather than individually domains which respectively correspond to active elements (not shown) of the semiconductor device 1. The strips of the top electrodes 19' extend along the second direction D2 and arranged along the first direction D1. Furthermore, after the patterning process in FIGS. 10A and 10B, the bottom electrode layers are further patterned to be bottom electrodes including the recessed bottom electrode layer 160' and the refilled bottom electrode layer 162'. The bottom electrodes respectively correspond to memory cells P of FIG. 1. With such configuration, the distance between adjacent two of the top electrodes (the bottom electrodes arranged along the first direction D1) is short, and the sizes of the top electrodes (bottom electrode) are enlarged.

In FIGS. 10A and 10B, the resistive random access memory film stack 106 is patterned by exposing the recessed barrier layer 140, the recessed bottom electrode layer 160, the refilled bottom electrode layer 162, the dielectric data storage film 18, the top electrode film 19, the first insulating film 120, and the second insulating film 122 (as shown in FIGS. 9A and 9B) to an etchant 40 in areas not covered by the masking layer 20' to form an etched barrier layer 140', a recessed bottom electrode 160', a refilled bottom electrode 162', the resistive layer 18', the top electrode layer 19', a first insulating layer 120', and a second insulating layer 122'. In some embodiments, the masking layer 20' may include a hard mask layer, such as silicon-oxide ($SiO_2$) or silicon-oxynitride (SiON). In some embodiments, the etchant 40 may include a dry etchant, such as, a plasma etchant, a RIE (reactive-ion etching) etchant, etc., or a wet etchant, such as, comprising hydrofluoric acid (HF).

Figure 11A:
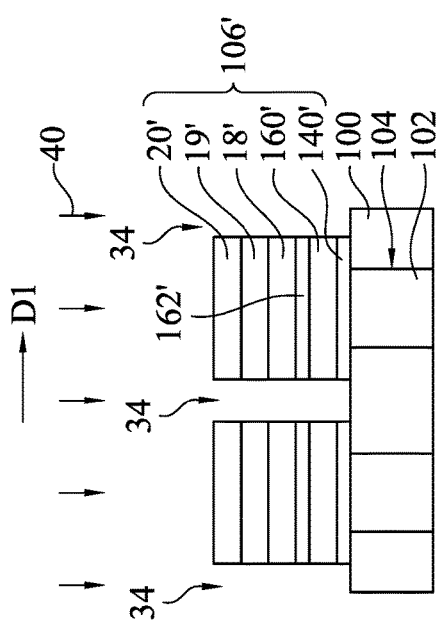
Figure 11B:
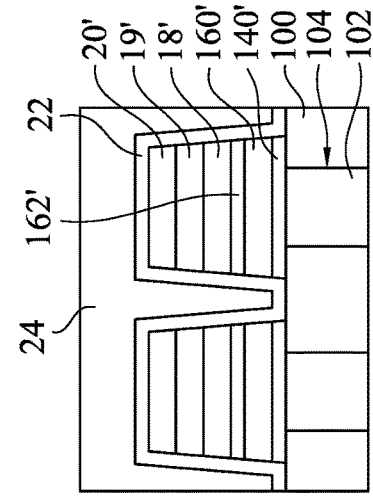

Reference is made to FIGS. 11A and 11B. The third insulating film 22 is formed conformally on the structure shown in FIGS. 10A and 10B. The third insulating film 22 can have a substantially uniform thickness in a direction substantially orthogonal to a corresponding underlying surface. In some embodiments, the third insulating film 22 is made of a material, such as, an oxide, a silicon rich oxide, silicon carbide (SiC), silicon oxycarbonnitride (SiOCN), silicon nitride (SiN), silicon carbonnitride (SiCN), or the like. The third insulating film 22 may be formed by, for example, chemical vapor deposition (CVD), plasma-enhanced chemical vapor deposition (PECVD), low-pressure chemical vapor deposition (LPCVD), atomic layer deposition (ALD), or combinations thereof.

Figure 12A:
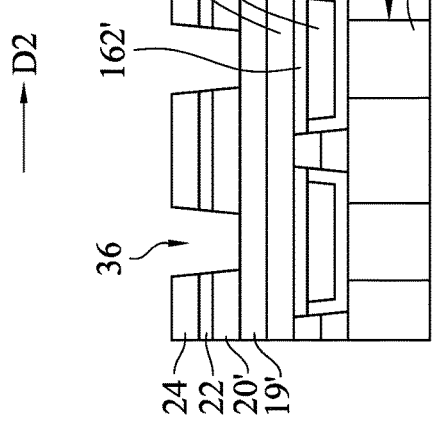
Figure 12B:
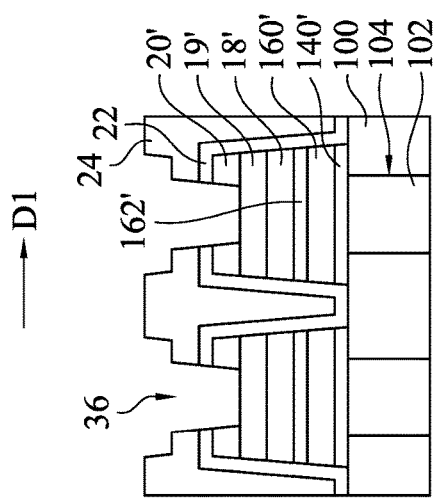

Reference is made to FIGS. 12A and 12B. As shown in FIGS. 12A and 12B, an upper inter-level dielectric (ILD) layer 24 is formed over an etched resistive random access memory film stack 106' and in the first trench 34 (shown in FIGS. 10A and 10B). The upper inter-level dielectric layer 24 and the masking layer 20' may be patterned to form a via hole 36 that extends from a top surface of the upper inter-level dielectric (ILD) layer 24 to a position abutting the top electrode layer 19'.

Figure 13A:
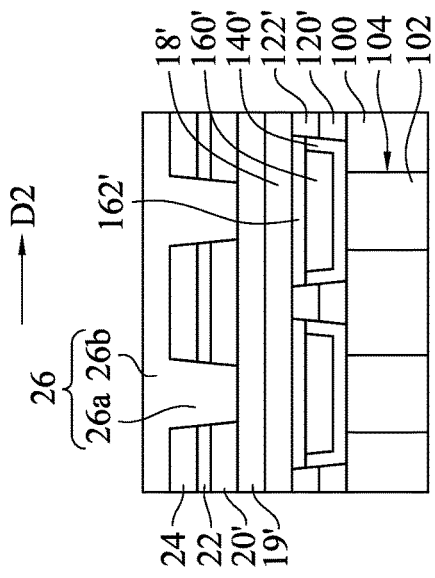
Figure 13B:
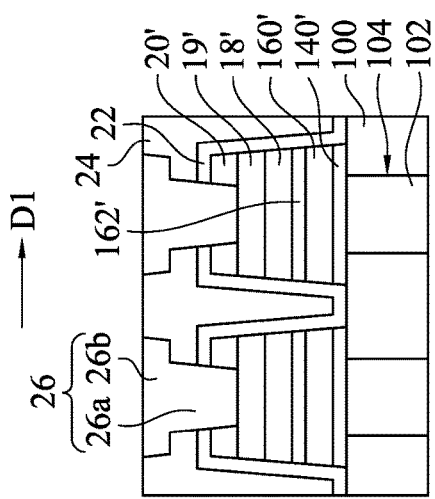

Reference is made to FIGS. 13A and 13B. As shown in FIGS. 13A and 13B, an upper metal interconnect layer 26 is formed at a position abutting the top electrode layer 19'. In some embodiments, the upper metal interconnect layer 26 includes an upper metal via 26a and an upper metal wire 26b. In some embodiments, the upper metal interconnect layer 26 may be formed by filling the via hole 36, and an overlying trench, with a metal (e.g., copper) to form the upper metal via 26a and the upper metal wire 26b, respectively.

Figure 14:
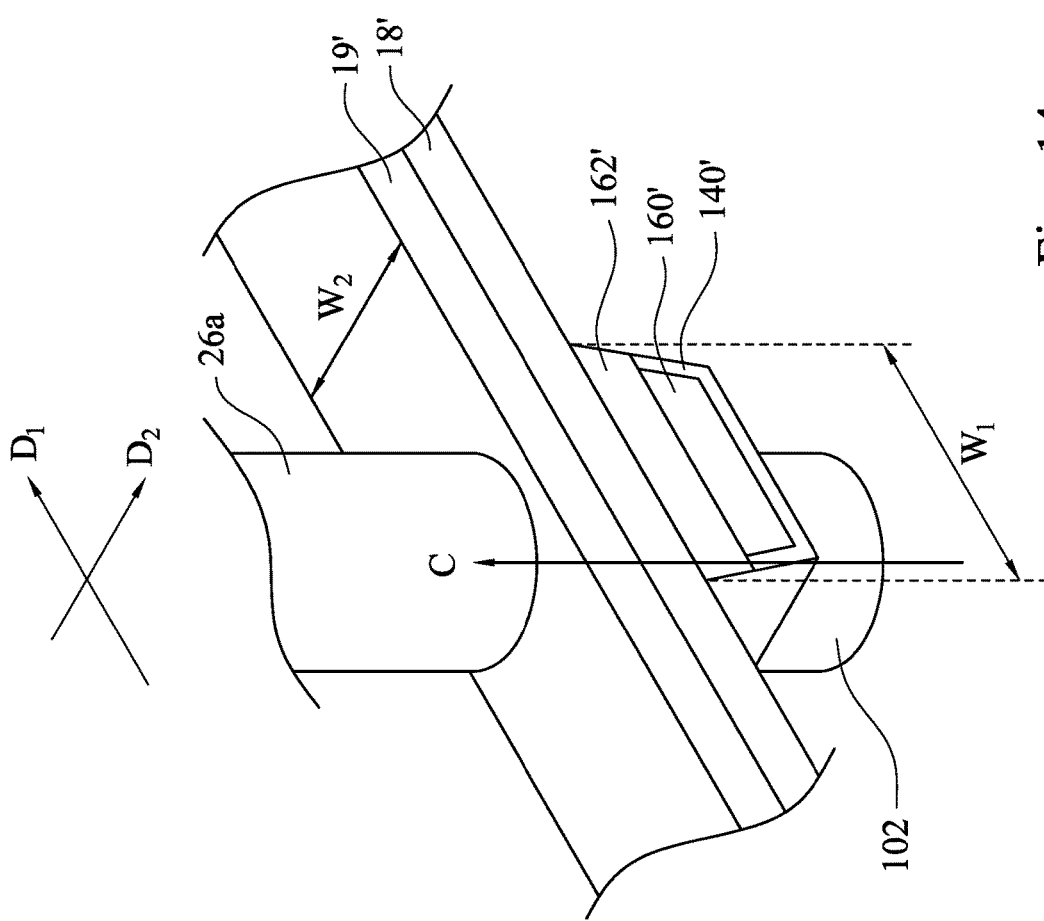
FIG. 14 is a local perspective view of the semiconductor device in FIG. 1.
Figure 15:
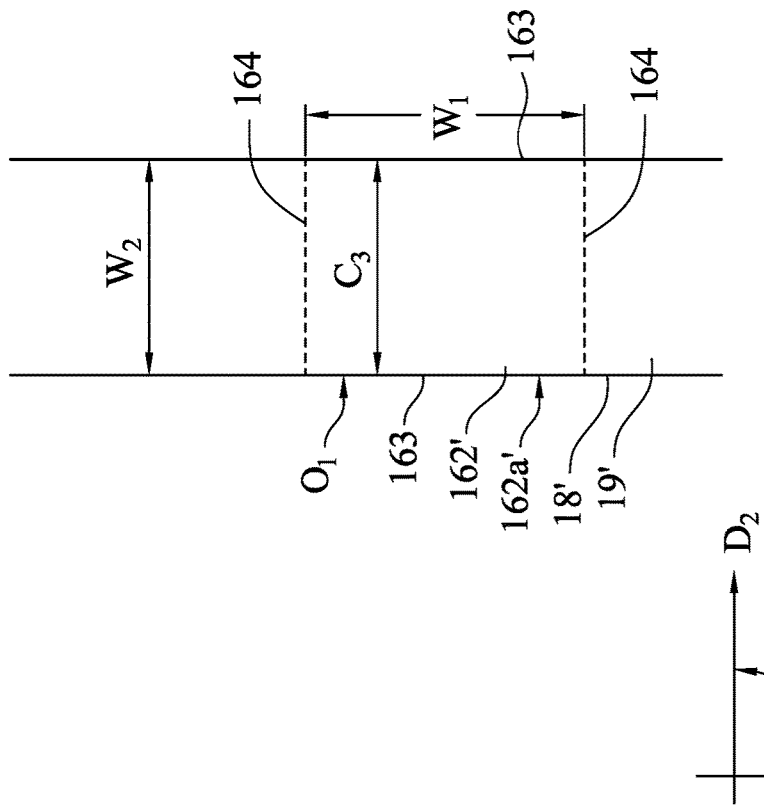
FIG. 15 is a top view of a top electrode, a resistive layer, and a bottom electrode in FIG. 14.

Reference is made to FIGS. 14 and 15. FIG. 14 is a local perspective view of a partial structure of the semiconductor device 1 in FIG. 1. It is understood that FIG. 14 has been simplified to omit the masking layer 20', the first insulating layer 120', the second insulating layer 122', the third insulating film 22, the upper inter-level dielectric layer 24, and the lower inter-layer dielectric layer 100 (shown in FIGS. 13A and 13B) for a understanding of the embodiments of the present disclosure. FIG. 15 is a top view of the top electrode layer 19', the resistive layer 18', and the refilled bottom electrode 162' in FIG. 14.

In FIGS. 14 and 15, the resistive layer 18' is disposed between the refilled bottom electrode 162' and the top electrode layer 19'. The top electrode layer 19' and the resistive layer 18' extend along the first direction D1, overlap the refilled bottom electrode 162', and have the same second width W2. A direction of the second width W2 is substantially orthogonal to opposite two sides of the top electrode layer 19' and/or the resistive layer 18'. The refilled bottom electrode 162' has opposite two sidewalls 163 parallel to the first direction D1, and the two opposite sidewalls 163 of the refilled bottom electrode 162' are separated from each other by a third distance C3, and the third distance C3 is substantially equal to the second width W2. In other words, a vertical projection of the two opposite sidewalls 163 of the refilled bottom electrode 162' is located on the opposite two sides of the top electrode layer 19' and/or the resistive layer 18', and the third distance C3 of the refilled bottom electrode 162' is defined by the second width W2 of the refilled bottom electrode 162' and/or the top electrode layer 19'.

Furthermore, the refilled bottom electrode 162' has another opposite two sidewalls 164 parallel to the second direction D2. The sidewalls 164 are in contact with the second insulating layer 122' as shown in FIG. 13B. The sidewalls 164 are separated from each other by a first width W1, and a vertical projection of ends thereof on the electrode layer 19' and/or the resistive layer 18' is located on the opposite two sides of the top electrode layer 19' and/or the resistive layer 18'. The resistive layer 18' and the top electrode 19' both extend past at least one sidewall 164 of the refilled bottom electrode 162'. For example, in FIGS. 14 and 15, the resistive layer 18' and the top electrode 19' both extend past two sidewalls 164 of the refilled bottom electrode 162'. Furthermore, the upper metal interconnect layer 26 in FIG. 13B also extends past two sidewalls 164 of the refilled bottom electrode 162'. In some embodiments, the second direction D2 intersects the first direction D1. A direction of the first width W1 is substantially orthogonal to the other opposite two sides of the refilled bottom electrode 162'. In FIGS. 14 and 15, the second direction D2 is substantially orthogonal to the first direction D1.

The semiconductor devices 1 use a "forming process," to prepare a memory device for use. In a forming process, an initial, higher current flow (i.e., based on a voltage difference) is needed to help change state for the first time, after which the operation of the device becomes relatively more consistent. The forming process is applied at the factory, at assembly, or at initial system configuration. The aforementioned structure can reduce the forming voltage of the resistive layer 18' and prevent the use of generally higher currents which presents a risk of damaging memory devices and causing failure, through electric field damage or other forms of overload, due to the semiconductor device 1 can be difficult or expensive in terms of silicon to generate or support a higher voltage associated with the forming process.

Specifically, when the active element (not shown) provides the current C to the lower metal interconnect layer 102, the current C will reach the upper metal interconnect layer 26 along the lower metal interconnect layer 102, the etched barrier layer 140', the recessed bottom electrode 160', the refilled bottom electrode 162', the resistive layer 18', the top electrode layer 19', and the upper metal interconnect layer 26 in sequence. Since the projection of the refilled bottom electrode 162' on the resistive layer 18' and/or the top electrode layer 19' has an overlapping area O1, and the overlapping area O1 is substantially equal to a contacting area 162a' of the refilled bottom electrode 162' and the resistive layer 18', the path in which the current C passing through is the portion of the overlapping area O1.

That is, the current C of the refilled bottom electrode 162' mainly flows from the overlapping area O1 of resistive layer 18' to the top electrode layer 19', so that the higher the overlapping area O1, the lower the forming voltage. In the aforementioned embodiments, the overlapping area O1 is defined by the second width W2 of the refilled bottom electrode 162' and/or the top electrode layer 19' and the W1 of the refilled bottom electrode 162'.

Figure 16:
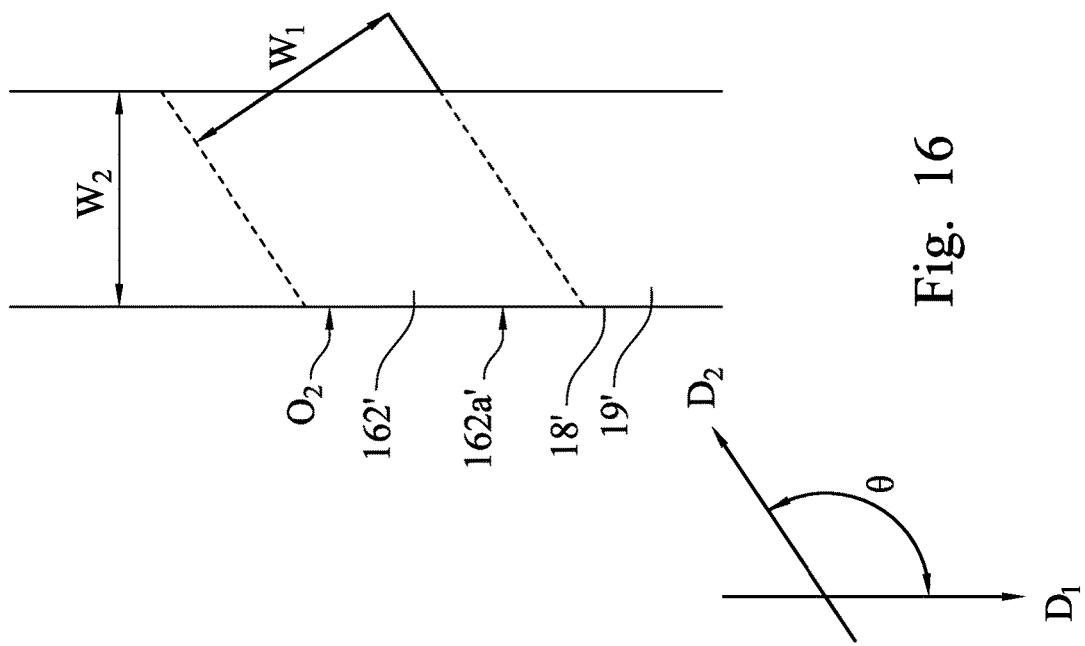
FIG. 16 is a top view of the top electrode, the resistive layer, and the bottom electrode according with some other embodiments of the present disclosure.

Reference is made to FIG. 16. FIG. 16 is a top view of the upper electrode, the resistive layer, and the bottom electrode according with some other embodiments of the present disclosure. In FIG. 16, the overlapping area O2 is defined by the second width W2 of the refilled bottom electrode 162' and/or the top electrode layer 19' and the W1 of the refilled bottom electrode 162'. The refilled bottom electrode 162' has opposite two sides parallel to the first direction D1. However, another opposite two sides of the refilled bottom electrode 162' is not parallel to the second direction D2. The another two opposite sides are separated from each other by a first width W1. The second direction D2 is not orthogonal to the first direction D1.

Figure 17:
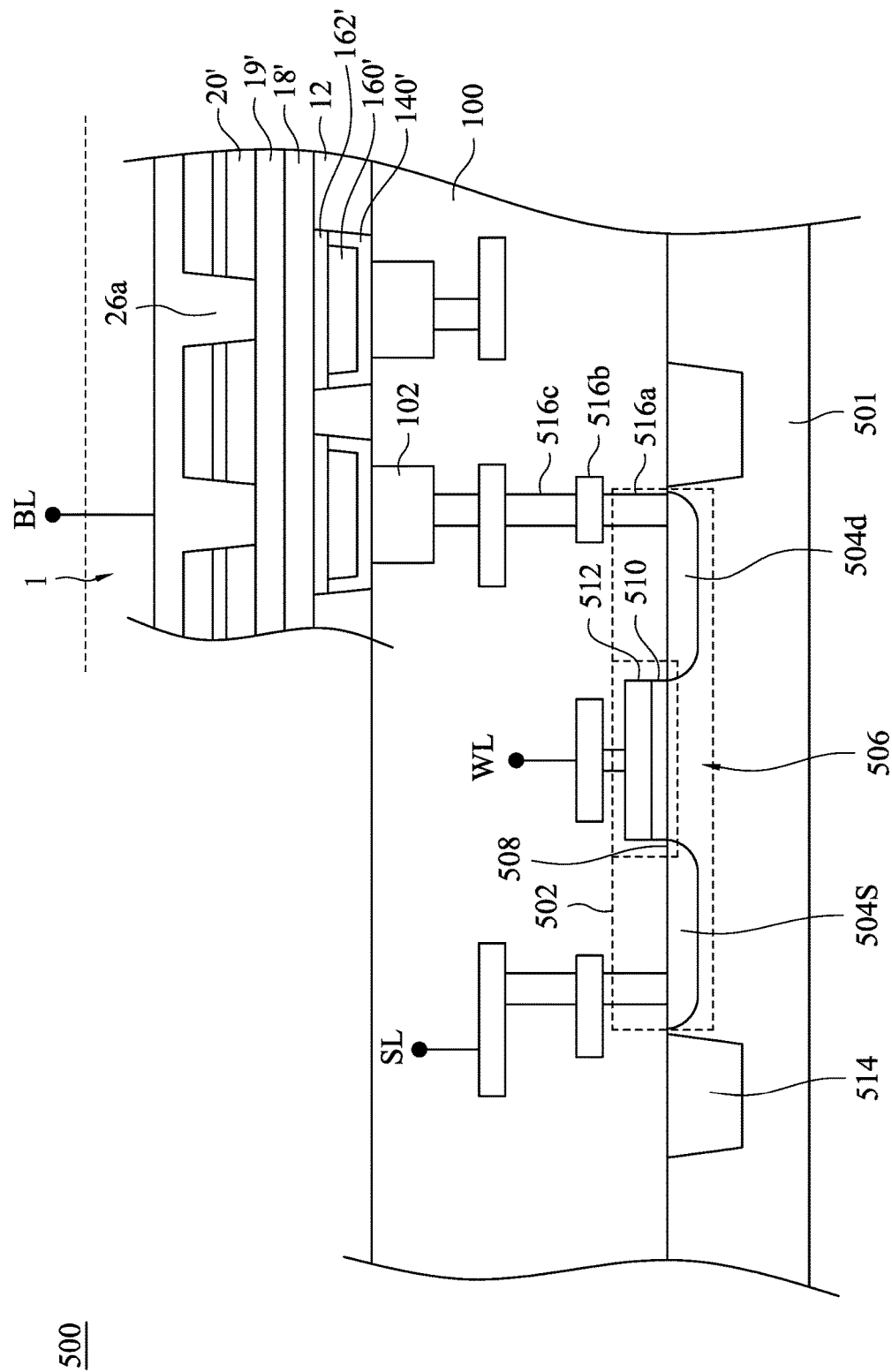
FIG. 17 is a cross-sectional view of the semiconductor device according with some embodiments of the present disclosure.

Reference is made to FIG. 17. FIG. 17 is a cross-sectional view of the semiconductor device 1 according with some embodiments of the present disclosure. The integrated chip 500 includes a transistor 502 as an active area. The transistor 502 having a source region 504s that is separated from a drain region 504d by a trench region 506. The source region 504s and the drain region 504d include highly doped regions. A gate region 508 includes a gate electrode 512 separated from the trench region 506 by a gate dielectric layer 510. In some embodiments, the transistor 502 may be arranged between isolation regions 514 (e.g., shallow trench isolation regions) within a semiconductor substrate 501. In some embodiments, a diode may replace the transistor 502 to electrically connect the semiconductor device 1.

A back-end-of-the-line (BEOL) metallization stack is arranged within the lower inter-layer dielectric layer 100 over the semiconductor substrate 501. In some embodiments, the lower inter-layer dielectric layer 100 may include one or more layers of an oxide, a low-k dielectric, or an ultra low-k dielectric. The back-end-of-the-line metallization stack includes a plurality of contacts 516a, metal wire layers 516b, and metal via layers 516c. In some embodiments, the plurality of contacts 516a, metal wire layers 516b, and metal via layers 516c may include copper, tungsten, and/or aluminum. The metal wire layers 516b include a source-line SL comprising a first metal interconnect wire that is electrically coupled to a source region 504s of the transistor 502.

In some embodiments, the source-line SL may be arranged in a second metal wire layer that is connected to source region 504s through a contact, a first metal wire layer, and a first metal via layer. The metal wire layers 516b further include a word-line WL comprising a second metal interconnect wire that is electrically coupled to a gate electrode 512 of the transistor 502. In some embodiments, the word-line WL may be arranged in the first metal wire layer that is connected to gate electrode 512 by way of a contact.

A semiconductor device 1 arranged within the back-end-of-the-line metallization stack at a location that is vertically between metal interconnect layers. The semiconductor 1 is vertically separated from the lower inter-layer dielectric layer 100 by the lower insulating structure 12. The semiconductor device 1 includes the etched barrier layer 140', the recessed bottom electrode 160', and the refilled bottom electrode 162'. The resistive layer 18' of the semiconductor device 1 having a variable resistance is located over the refilled bottom electrode 162', the top electrode layer 19' is disposed over the resistive layer 18', and a capping layer may be arranged between the resistive layer 18' and the top electrode layer 19'. In FIG. 17, the masking layer 20' is arranged onto the top electrode layer 19'. The upper metal via 26a extends through the masking layer 20' to contact the top electrode layer 19'.

According to some embodiments, a semiconductor device includes at least one bottom electrode, a resistive layer, and a top electrode. The bottom electrode has two opposite sidewalls. The resistive layer is disposed on the bottom electrode, extends past at least one of the two opposite sidewalls of the at least one bottom electrode, and has a variable resistance. The resistive layer is disposed on the bottom electrode and extends past at least one of the two opposite sidewalls of the at least one bottom electrode.

According to some embodiments, a semiconductor device includes a first bottom electrode, a second bottom electrode, a resistive layer, and a top electrode. The second bottom electrode is separated from the first bottom electrode. The resistive layer is disposed on and in contact with the first bottom electrode and the second bottom electrode, and has a variable resistance. The top electrode is disposed on the resistive layer.

According to some embodiments, a method for manufacturing a semiconductor device includes forming an insulating structure; patterning the insulating structure to form at least one through hole therein, in which the through hole extends along a first direction; forming a bottom electrode strip in the through hole of the insulating structure; forming a resistive film on and in contact with the bottom electrode strip, in which the resistive film has a variable resistance; forming a top electrode film on the resistive film; and patterning the top electrode film, the resistive film, and the bottom electrode strips to form at least one trench in the top electrode film, the resistive film, and the bottom electrode strips, in which the trench extends along a second direction intersecting the first direction with an angle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first bottom electrode layer having two opposite sidewalls;
   a barrier layer on a bottom surface and on the two opposite sidewalls of the first bottom electrode layer;
   a resistive layer disposed above the first bottom electrode layer, extending past at least one of the two opposite sidewalls of the first bottom electrode layer, and having a variable resistance;
   a second bottom electrode layer between the first bottom electrode layer and the resistive layer and extending past at least one of the two opposite sidewalls of the first bottom electrode layer;
   a top electrode disposed above the resistive layer and extending past at least one of the two opposite sidewalls of the first bottom electrode; and
   an insulating film in contact with the first bottom electrode layer.

2. The semiconductor device of claim 1, wherein the barrier layer surrounds the opposite sidewalls of the first bottom electrode layer.

3. The semiconductor device of claim 1, wherein the barrier layer is in contact with a bottom surface of the second bottom electrode layer.

4. The semiconductor device of claim 1, wherein the second bottom electrode layer is disposed between the resistive layer and the barrier layer to separate the resistive layer and the barrier layer.

5. The semiconductor device of claim 1, wherein the second bottom electrode layer has a sidewall that aligns with the barrier layer.

6. The semiconductor device of claim 1, further comprising an insulating structure disposed adjacent to the first and second bottom electrode layers, wherein the insulating structure is in contact with at least one of the two opposite sidewalls of the second bottom electrode layer.

7. The semiconductor device of claim 6, wherein the resistive layer is in contact with the insulating structure.

8. The semiconductor device of claim 1, further comprising an insulating structure disposed adjacent to the first and second bottom electrode layers and in contact with the second bottom electrode layer and the barrier layer.

9. The semiconductor device of claim 8, wherein the insulating structure is separated from the first bottom electrode layer.

10. The semiconductor device of claim 1, further comprising an upper metal interconnect layer electrically connected to the top electrode and extending past at least one of the two opposite sidewalls of the first bottom electrode layer.

11. The semiconductor device of claim 10, further comprising an active device electrically connected to the first bottom electrode unit.

12. A semiconductor device, comprising:
a first bottom electrode unit and a second bottom electrode unit spaced apart from the first bottom electrode unit;
a resistive layer disposed above and in contact with the first bottom electrode unit and the second bottom electrode unit, having a variable resistance, wherein a sidewall of the resistive layer is substantially coplanar with at least one of sidewalls of the first and second bottom electrode units; and
a top electrode disposed above the resistive layer, wherein each of the first and second bottom electrode units comprises a first bottom electrode layer and a second bottom electrode layer that is between the first bottom electrode layer and the resistive layer and that extends past a sidewall of the first bottom electrode layer.

13. The semiconductor device of claim 12, further comprising an insulating structure disposed between the first bottom electrode unit and the second bottom electrode unit.

14. The semiconductor device of claim 13, wherein the insulating structure is in contact with the first bottom electrode unit, the second bottom electrode unit, and the resistive layer.

15. A method for manufacturing a semiconductor device comprising:
forming an insulating structure;
patterning the insulating structure to form at least one through hole therein, wherein the through hole extends along a first direction;
forming a bottom electrode strip in the through hole of the insulating structure;
forming a resistive film on and in contact with the bottom electrode strip, wherein the resistive film has a variable resistance;
forming a top electrode film on the resistive film; and
patterning the top electrode film, the resistive film, and the bottom electrode strips to form at least one trench in the top electrode film, the resistive film, and the bottom electrode strips, wherein the trench extends along a second direction intersecting the first direction with an angle.

16. The method of claim 15, wherein the forming the bottom electrode strips comprises:
conformally forming a barrier electrode in the through holes of the insulating structure; and
forming a first bottom electrode layer on the barrier electrode.

17. The method of claim 15, further comprising conformally forming an insulating film on the patterned top electrode film, the resistive film, and the bottom electrode strips.

18. The method of claim 15, further comprising forming an upper metal interconnect layer electrically connected to the patterned top electrode film.

19. The method of claim 16, wherein the forming the resistive film comprises forming the resistive film on and in contact with the insulating structure.

20. The method of claim 16, wherein the forming the bottom electrode strips further comprises:
removing portions of the first bottom electrode layer and the barrier layer in the through holes of the insulating structure; and
forming a second bottom electrode layer on the first bottom electrode layer and the barrier layer.

* * * * *